United States Patent [19]

Bramwell

[11] Patent Number: 6,097,193
[45] Date of Patent: Aug. 1, 2000

[54] VEHICLE STARTING BATTERY COLD-CRANKING AMPS METER AND METHOD

[75] Inventor: Denton M. Bramwell, Layton, Utah

[73] Assignee: Madill Technologies, Inc., Rockford, Mich.

[21] Appl. No.: 09/028,270

[22] Filed: Feb. 23, 1998

Related U.S. Application Data

[63] Continuation of application No. 08/711,962, Sep. 6, 1996, Pat. No. 5,721,688.
[60] Provisional application No. 60/003,453, Sep. 8, 1995, and provisional application No. 60/010,487, Jan. 23, 1996.

[51] Int. Cl.[7] .................................................. G01N 27/416
[52] U.S. Cl. ............................ 324/429; 324/427; 324/430
[58] Field of Search .................................. 324/426, 427, 324/429, 430, 431, 500, 503; 320/48, 43, 44

[56] References Cited

U.S. PATENT DOCUMENTS

| | | | |
|---|---|---|---|
| 3,651,399 | 3/1972 | Florance et al. | 324/541 |
| 3,781,658 | 12/1973 | Godshalk | 324/431 |
| 3,876,931 | 4/1975 | Godshalk | 324/429 |
| 4,193,025 | 3/1980 | Frailing et al. | 324/427 |
| 4,698,584 | 10/1987 | Morin | 324/715 |
| 4,719,428 | 1/1988 | Liebermann | 324/436 |
| 4,764,727 | 8/1988 | McConchie, Sr. | 324/503 |
| 4,884,033 | 11/1989 | McConchie, Sr. | 324/503 |
| 4,912,416 | 3/1990 | Champlin | 324/430 |
| 4,937,528 | 6/1990 | Palanisamy | 324/430 |
| 4,952,862 | 8/1990 | Biagetti et al. | 320/48 |
| 5,049,803 | 9/1991 | Palanisamy | 320/132 |
| 5,061,898 | 10/1991 | Oram et al. | 324/427 |
| 5,124,627 | 6/1992 | Okada | 320/44 |
| 5,126,680 | 6/1992 | Morin et al. | 324/724 |
| 5,159,274 | 10/1992 | Lieux et al. | 324/538 |
| 5,254,951 | 10/1993 | Goto et al. | 324/426 |
| 5,254,952 | 10/1993 | Salley et al. | 324/429 |
| 5,281,919 | 1/1994 | Palanisamy | 324/427 |
| 5,345,182 | 9/1994 | Wakamatsu | 324/649 |
| 5,357,203 | 10/1994 | Landau et al. | 324/427 |
| 5,365,180 | 11/1994 | Edelman | 324/715 |
| 5,381,096 | 1/1995 | Hirzel | 324/427 |
| 5,386,188 | 1/1995 | Minneman et al. | 324/126 |
| 5,426,371 | 6/1995 | Salley et al. | 324/429 |
| 5,519,304 | 5/1996 | Andrieu et al. | 320/48 |
| 5,572,136 | 11/1996 | Champlin | 324/426 |
| 5,631,831 | 5/1997 | Bird et al. | 364/424.034 |
| 5,831,435 | 11/1998 | Troy | 324/426 |

FOREIGN PATENT DOCUMENTS

| | | |
|---|---|---|
| 0432689 A2 | 6/1991 | European Pat. Off. . |
| 0616226 A1 | 9/1994 | European Pat. Off. . |
| 8302005 | 6/1983 | WIPO . |

OTHER PUBLICATIONS

Supplementary European Search Report from corresponding European Application No. EP 96 93 1483 dated May 25, 1998.

Berndt et al., "Monitoring of Stationary Valve Regulated Lead Acid Batteries," *IEEE*, Nov., 1991.

*Primary Examiner*—Josie Ballato
*Assistant Examiner*—T. R. Sundaram
*Attorney, Agent, or Firm*—Van Dyke, Gardner, Linn & Burkhart, LLP

[57] ABSTRACT

A vehicle starting battery cold-cranking amps meter and associated method includes providing a current source, a voltage meter, a current meter and a control. The current source produces a current pulse during a brief time interval at a known magnitude that is less than rated cold-cranking amps of the vehicle starting battery being tested. The volt meter measures battery terminal voltage of the vehicle storage battery being tested while the current source is sourcing current to or sinking current from the vehicle starting battery being tested. The control determines internal impedance of the vehicle starting battery being tested from the terminal voltage of the vehicle starting battery while the current source is sourcing current to or sinking current from the vehicle starting battery being tested and determines cold-cranking amps from the internal impedance and an output of the temperature meter.

26 Claims, 6 Drawing Sheets

VEHICLE STARTING BATTERY COLD-CRANKING AMPS METER AND METHOD

CROSS-REFERENCE TO RELATED APPLICATIONS

This application is a continuation of application Ser. No. 08/711,962, filed Sep. 6, 1996, now U.S. Pat. No. 5,721,688, which claims priority from provisional patent application Ser. No. 60/003,453 filed Sep. 8, 1995, by Denton M. Bramwell and Ser. No. 60/010,487 filed Jan. 23, 1996, by Denton M. Bramwell, the disclosures of which are hereby incorporated herein by reference.

BACKGROUND OF THE INVENTION

This invention relates to a method and apparatus for measuring electrical characteristics of an electrical system and, in particular, the characteristics of an electrical energy delivery system. The invention is particularly adapted for evaluating characteristics of a vehicle electrical system, but has applications in many different types of electrical systems.

In many test settings, it is useful to be able to determine circuit parameters, such as resistance, total energy source and cable performance, and current flowing in a circuit. This is especially useful for troubleshooting electrical problems in vehicles, such as automobiles, trucks, boats and the like. Very often components, such as batteries, starter motors, alternators, and the like, are returned under warranty to the manufacturer, only to find that they are not defective.

Presently, the common method of assessing battery condition is to connect a voltmeter to the terminals of the battery, to apply a small value resistor capable of dissipating a large amount of heat to the battery terminals, and to observe terminal voltage as a function of time while the battery discharges. This test permanently changes the battery, the test cannot effectively be performed unless the battery is fully charged, and the results must be compensated for battery temperature in order to be accurate.

Another alternative for testing a battery is to apply a small AC signal to the terminals of the battery, and use a Wheatstone (or one of its derivatives) bridge to measure the internal resistance of the battery. Battery internal resistance is related to battery condition, and this test has the advantages of allowing a relatively small test apparatus that does not materially affect the condition of the battery, and which can be applied to batteries that are less than fully charged.

In many cases, a conventional ohmmeter is useless in determining wire and connection resistance because the resistance is too small. Choosing the example of an automobile electrical system, approximately 200 amperes are required to crank the engine. In this case, resistances as small as 10 milliohms are a significant problem, but well below the range of a conventional ohmmeter. In this case, the usual recommended procedure is, again, to attach a low value resistance to the system, drawing a large current through the wire(s) and/or connection(s) to be tested, and quickly measuring the voltage drop(s) to infer system resistance.

The measurement of current is usually accomplished in one of two ways: an in-circuit ammeter, or a clamp-on device that infers current from the surrounding magnetic field.

Insertion of an in-circuit ammeter requires that the circuit be broken, and the meter inserted, so that the current to be measured flows through the meter. This has the disadvantage of being awkward to do. It is also usually limited to currents below 50 amperes, by the practical constraints of meter and connector resistance.

Clamp-on current probes that infer current from the magnetic field surrounding a current are more convenient. However, inexpensive models offer only limited accuracy and are unable to measure currents below roughly 10 amperes with acceptable accuracy. Accurate models tend to be quite expensive.

There is no commonly available means of making a one-step assessment of a system consisting of an electrical energy source and conductors used to deliver the electrical energy to a destination.

The apparatus described here has many applications, including tests of vehicle and stationary batteries, measurement of resistances as small as a fraction of a milliohm, one-step appraisal of a system consisting of a source of electrical energy and connecting cables, and measurement of current flowing in a circuit, all using the same basic circuit.

SUMMARY OF THE INVENTION

The present invention provides a method and apparatus which quickly and accurately measure various parameters of the electrical system of a vehicle in a manner which avoids the known drawbacks of the prior art. Although the invention is primarily applicable to the electrical system of vehicles, it finds application in other electrical systems such as those employing DC motors, namely material handling equipment and the like.

A storage battery device may be tested according to an aspect of the invention by sourcing a current to, or sinking a current from, a battery at less than maximum battery capacity during one or more brief intervals of time. Terminal voltage and internal impedance, along with battery temperature, are measured and used to infer a figure of merit. The figure of merit may be, for example, cold-cranking amps. The internal impedance of the battery may be measured utilizing resistance/conductance measurement techniques according to other aspects of the invention. The sourcing of current to, or sinking of current from, the battery along with the attendant measurements of electrical parameters, is under the control of a microcomputer. The microcomputer controls the measurement circuit and calculates the results, which may be readily displayed for the user from the measured electrical parameters.

A method of measuring cold-cranking amps of a vehicle storage battery having rated cold-cranking amps according to an aspect of the invention includes sourcing a current of known magnitude to or sinking a current of known magnitude from a vehicle starting battery at less than rated cold-cranking amps of the vehicle storage battery during at least one brief interval of time. The method further includes measuring terminal voltage of the vehicle starting battery during the sourcing or sinking and determining internal impedance of the starting battery from at least the measured terminal voltage. The method further includes measuring temperature of the vehicle starting battery and calculating cold-cranking amps from the internal impedance and measured temperature.

A vehicle starting battery cold-cranking amps meter according to another aspect of the invention includes a current source, a voltage meter, a temperature meter and a control. The current source produces a current pulse during a brief time interval at a known magnitude that is less than rated cold-cranking amps of the vehicle starting battery being tested. The voltage meter measures battery terminal voltage of the vehicle storage battery being tested while the current source is sourcing current to or sinking current from the vehicle starting battery being tested. The control determines internal impedance of the vehicle starting battery being tested from an output of the voltage meter while the current source is sourcing current to or sinking current from the vehicle starting battery being tested and determines cold-cranking amps from the internal impedance and an output of the temperature meter.

When the invention is applied to the electrical system of a vehicle, a compact measurement instrument is provided, which is fully integrated and facilitates accurate tests to be performed without putting undue stress on the vehicle's electrical system or components thereof. When the invention is applied to other electrical systems, such as to measuring the resistance/conductance of a DC motor, the measurement may be made without causing rotation of the motor. This is accomplished notwithstanding the fact that currents of a sufficient magnitude to avoid DC circuit noise are utilized because the currents are applied for a brief period of time that is insufficient to apply sufficient energy to rotate the motor.

Illustrative embodiments of various aspects of the invention are set forth below. Other examples will be apparent to those skilled in the art.

These and other objects, advantages, and features of this invention will become apparent upon review of the following specification in conjunction with the drawings.

DESCRIPTION OF THE PREFERRED EMBODIMENT

Figure 1:
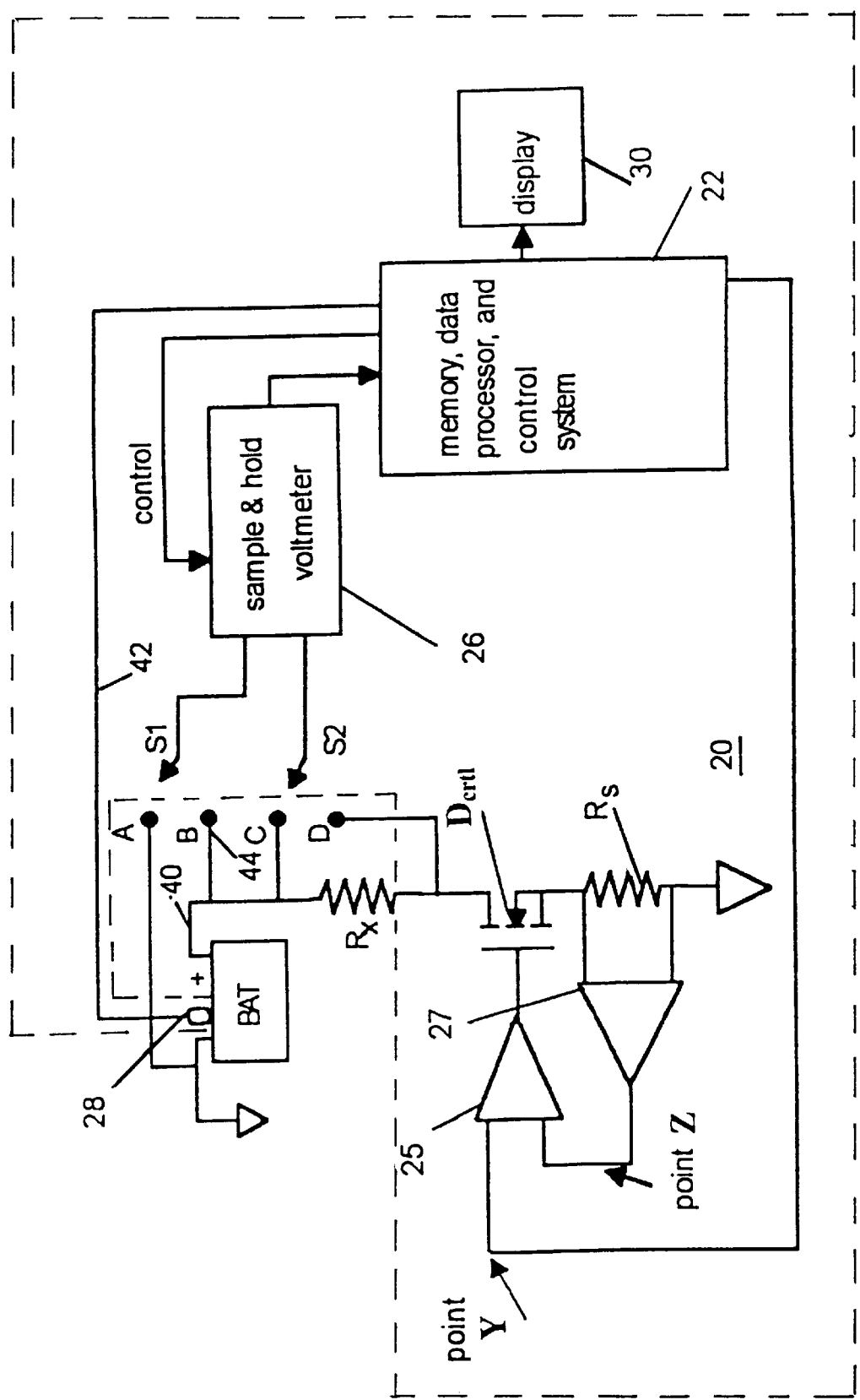
FIG. 1 is a block diagram of an electrical system measurement apparatus according to the invention.

The circuit for an electrical system measurement apparatus 20 is shown in FIG. 1. $D_{ctrl}$ is a current control device, such as a transistor or field effect transistor, which controls the current through a sense resistor, $R_S$, and another resistance, $R_X$. When a voltage is applied by the memory, data processor, and control system, collectively referred to as control system 22, to a current control point A of a control amplifier 25, which amplifies the difference between the voltage at point A and the output of point B of a differential amplifier 27, which senses the voltage across resistor $R_S$, causes current is drawn through $R_S$ and $R_X$ such that the voltage at points Y and Z will be equal. In this way, any desired current amplitude and waveform may be drawn through $R_S$ and $R_X$ under the control of control system 22. By setting switches S1 and S2, and drawing test currents through $R_S$ and $R_X$, simultaneously observing the voltage measured by a voltmeter 26, and, in some cases, performing mathematical operations on the values of voltage and current, useful diagnostic information is produced. In addition, an optional thermal sensor 28 is shown for measuring battery temperature. For battery measurements, the information produced by this device allows for temperature compensation, producing a more accurate result, as will be described in more detail below.

In the illustrated embodiment, the memory, data processing, and control system 22 will be a microprocessor, either with a built-in digital-to-analog converter or driving an external digital-to-analog converter. For the sake of reduced power dissipation, voltmeter 26 is preferably a sampling type, so that measurements may be taken during a brief interval.

TEST OF BATTERY CONDITION

The condition of a battery can be inferred from three variables: state of charge, temperature, and internal resistance. If the battery is free from polarization (also known as "surface charge"), state of charge may be estimated by the terminal voltage of the battery with no load applied. Call this variable $V_{OC}$. Call temperature T. Let the internal resistance of the battery be $R_1$. Let the figure of merit for the battery be FOM. In the illustrated embodiment, FOM is the Cold Crank Ampere rating (CCA) of the battery. Thus, FOM is some function of $V_{OC}$, T, and $R_1$.

$$FOM = f(V_{OC}, T, R_1)$$

In the illustrated embodiment, $R_1$ is determined by applying and/or removing power to/from the battery, BAT, observing the resulting changes in terminal voltage, and performing calculations in memory, data processor, and control system 22. Alternatively, FOM can be expressed directly in terms of $V_{OC}$, T, $E_{MEASURED}$, and $I_{TEST}$, where $I_{TEST}$ is the known test current, and $E_{MEASURED}$ is the battery terminal voltage while $I_{TEST}$ is flowing. Some or all calculations may be avoided or simplified by the wise choice of test currents as would be apparent to the skilled artisan.

Control system 22 will: (1) determine whether the battery is 12 or 24 volts, whether it is charged enough to make a test, and whether the "surface charge" of the battery has been drained, then (2) measure temperature, terminal voltage (to determine state of charge), and internal impedance, and (3) calculate and display a figure of merit, such as CCA. Thus, the operator has little to do except attach the test leads and read the result on a display 30.

A thermal sensor, TS, is in the voltage probe of the instrument, which is in intimate thermal contact with the battery (BAT). The temperature of the battery is "read" by the data processor and stored for calculations.

The terminal voltage of the battery is measured with no (or infinitesimally small) test current drawn. The voltage drop across the internal resistance of battery BAT, designated $R_1$, is then $E_0$, which will be zero if no non-test current is flowing. When control system 22 produces an output, and the test current is drawn, a voltage drop will appear across $R_1$, and the terminal voltage of the battery will be reduced accordingly. The Loop Rule provides that the unloaded voltage minus the loaded voltage is the drop across the internal resistance. $R_1$ is then $(E_{TEST}-E_0)/I_{TEST}$.

Another approach is to draw two current pulses of different amplitude, and, again, invoke the linear superposition principle. $R_i$ is then $(E_1-E_2)/(I_1-I_2)$. Since battery voltage does not instantaneously assume its equilibrium voltage under load, a two-pulse system has the advantage of reducing errors due to settling time. Yet, another approach is to supply one pulse, or two pulses of different amplitude, to the battery and make the same measurements and calculations as above, The same equations govern the "source" situation as the "sink" situations. In the illustrated embodiment, current pulses in the range of between approximately 0.01 amperes and 100 amperes are applied for approximately 0.1 milliseconds to approximately 10 milliseconds.

In yet another method of measuring the internal resistance of a battery, a variable current sink or source is applied to the terminals of the battery. Battery terminal voltage is monitored through a voltmeter 26, which, in turn, connects to a comparator internal to control system 22. Under the control of control system 22, the current sink or source draws or supplies increasing current, until the comparator changes state. This change of state is signaled to the data processor. At this point, the data processor "knows" the amount of current required to produce the predetermined change in battery terminal voltage and can, thus, calculate internal resistance by the formula R=E/I.

In yet another method of measuring the internal resistance of battery BAT, a constant current equal to about half of the battery's rated cold-cranking amps capacity is drawn from the battery. The terminal voltage declines at a rate on the order of 0.2 volts per second, or 0.2 millivolts per millisecond If current is drawn for a few milliseconds, the battery terminal voltage will change by several tenths of a millivolt, which is quite measurable. Knowing the test current, and the slope of the discharge curve during the test interval, the rate of change of internal resistance can be calculated. From this, the time required for the battery to reach the minimum acceptable terminal voltage can be calculated.

Through amplifiers 25, 27, control system 22 sets a test current from battery BAT through R, After the battery voltage settles, the data processor commands voltmeter 26 to sample BAT voltage. The reading is then stored in memory for future calculations. The data processor waits a predetermined time and commands a second sample to be taken. The second sample is then stored. From the two stored voltage values, the slope of the voltage decline curve is determined and a figure of merit for the battery calculated and displayed.

Figure 2:
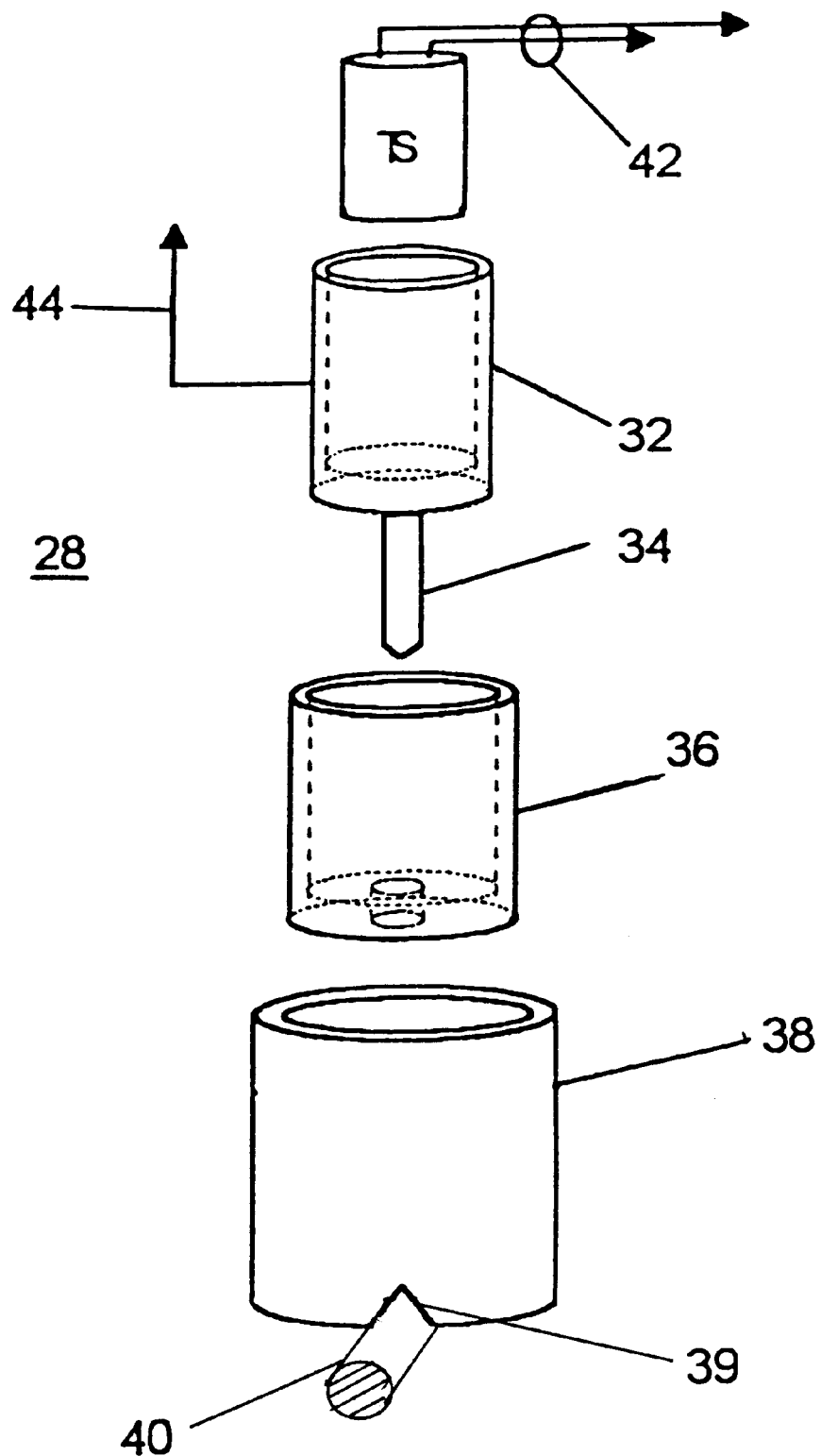
FIG. 2 is an exploded perspective of a battery temperature sensor useful with the invention.

One of the variables used in battery figure of merit calculations is battery temperature. Existing products require the user to manually enter an estimate of battery temperature. This slows the measurement and introduces error. A more preferable arrangement is to automatically acquire a real measurement of temperature. In FIG. 2, a thermal sensor, TS, is embedded in a hollow metal part 32 with a point, or probe tip, 34 that makes contact with a wire in the circuit under test (Voltage probe tip) in order to supply a voltage signal on a line 44 to voltmeter 26 indicative of battery terminal voltage. This wire may be lead 40 to one of the kelvin clips connecting measurement apparatus 20 to the positive terminal of battery BAT. Part 32 is, in turn, encased in an insulating sleeve 36 with metal point 34 protruding. This whole assembly is then held inside a metal sleeve 38 with a notch 39 cut in the end. This notch ensures that the voltage probe tip is centered on wire 40. Thermal sensor TS reports battery temperature data to control system 22 over lines 42. If kelvin clips are used to connect measurement apparatus 20 to battery BAT, thermal sensor TS may simply be attached to the clip, but thermally insulated from it, so that it comes into contact with the battery post and "reports" battery temperature relatively unaffected by the thermal characteristics of the kelvin clip.

Figure 3:
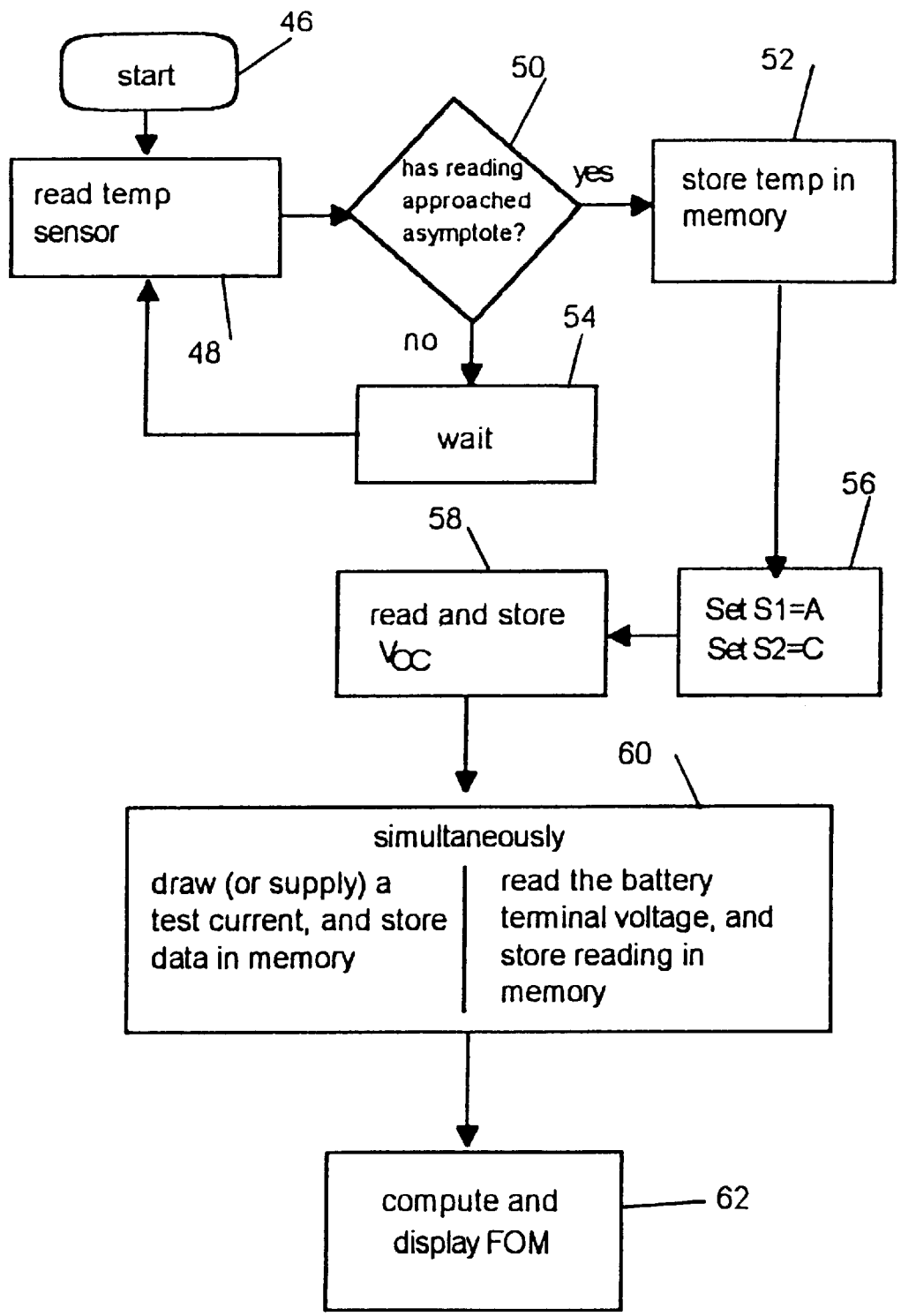
FIG. 3 is a flow chart of a method of measuring a battery figure of merit according to the invention.

The flowchart in FIG. 3 shows how the battery test can be performed using a simple, short, current pulse. When the method is initiated at 46, temperature sensor 28 is read and it is determined at 50 whether the temperature reading has settled. If not, the control waits at 54 for a period of time and takes another temperature reading at 48. If the temperature reading has settled, the temperature reading is stored in memory at 52. Switch S1 is then set in the A position and switch S2 in the C position. Battery voltage $V_{cc}$ is then read with voltmeter 26 and stored in memory. Control system 22 then either causes a known test current to be supplied to the battery while reading and storing battery terminal voltage $V_{cc}$, or causes a known test current to be sank from the battery while reading and storing battery terminal voltage. Control system 22 then computes CCA using principles set forth above and displays the value on display 30. In practice, other, more complex forms of applied current provide advantages of noise immunity and cancellation of second order errors. For example, the difference of two pulses may be used to cancel errors due to battery terminal voltage drop during the voltage measurement interval or AC may be used with synchronous detection to remove artifacts caused by nearby conductors.

RESISTANCE OF WIRES AND CONNECTIONS

Figure 4:
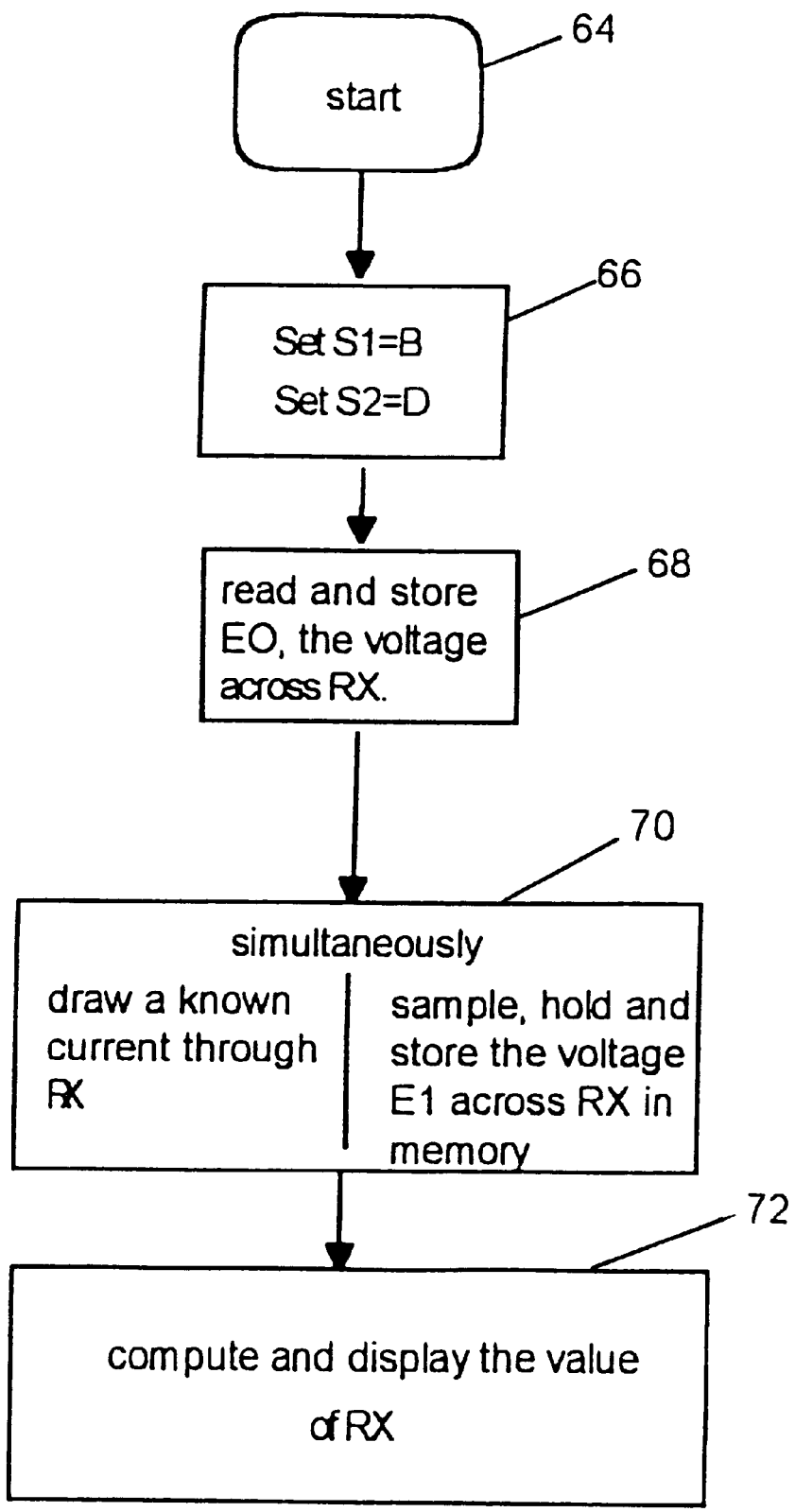
FIG. 4 is a flow chart of a method of measuring the value of a resistance according to the invention.

A very similar procedure can be used for making measurements of small resistances. In this case, the battery BAT, is no longer the device under test. Instead, the resistance of a resistance under test (RUT) $R_X$, which may be a length of conductor, an electrical joint, or a combination of conductors and joints is measured. In practice, any connection between battery BAT and RUT is broken and a small battery internal to the measurement apparatus 20 supplies current to the RUT. This procedure is shown in FIG. 4, which utilizes short duration pulses to measure the resistance of RUT. The test may be performed with non-test current flowing through $R_X$, this current being ignored. In a vehicle, this might be the current used to supply some device that is never turned off, such as a clock.

When a resistance test measurement method is started at 64, switch S1 is set to position B and switch S2 is set to position D at 66. The initial voltage $E_0$ across $R_X$ is measured using voltmeter 26 and stored in memory at 68. Control system 22 then causes amplifiers 25, 27 to draw a known current through resistor $R_X$ while voltmeter 26 samples, and holds voltage E1 across resistor $R_X$. The value of voltage E1 is stored in memory at 70. Control system 22 then computes the resistance of $R_X$ at 72 using the linear superposition principle. This effectively ignores any non-test current flowing ii the circuit by using the formula:

$$R_x = (E_1 - E_0)/I_{TEST}$$

The ability to make a resistance measurement in the presence of a non-test current is very useful, since it makes it unnecessary to turn off the electrical system under test in order to make a resistance measurement. In the illustrated embodiment, kelvin connections, or clips, are used to connect measurement apparatus 20 to the resistance under test (RUT).

The most basic approach is to run some current, say 1 ampere, through the wire or connection to be tested (RUT). It is then possible to measure the voltage drop across the RUT and, knowing the amount of current flowing through it, calculate resistance. One ampere is a convenient choice, since the resistance of the RUT is numerically equal to the current flowing through it. This gives a value, but could include errors if there is any non-test voltage drop across the RUT, as will often be the case in vehicles. To allow resistance RUT to be measured in the presence of non-test current, two measurements are made. $E_1$ is the voltage drop across RUT with any non-test currents, the sum of which is $I_1$ flowing, and $E_2$ is the voltage drop with both test and non-test currents flowing. Test current plus non-test current is designated $I_2$. The linear superposition principle provides $R=(E_1-E_2)(I_1-I_2)$. Because $I_1-I_2$ is equal to the test current, which is known, the value of R is readily calculated.

Another method of measuring resistance of the RUT is to run equal pulses of current through the RUT, first in one direction, then in the opposite direction. Two voltage samples are taken, one for each of the two directions of current flow. Again, linear superposition provides $R_X=(E_1-E_2)/(I_1-I_2)$, where $R_X$ is the resistance of the device under test, $E_1$ is the voltage across $R_X$ with $I_1$ flowing, and $E_2$ is the voltage across $R_X$ with $I_2$ flowing. If a non-test current is also flowing in the circuit, $I_1$ is composed of $I_0$, the non-test current, and $I_{T1}$, which is the first test pulse. The values of $I_1$ and $I_2$ can be calculated using the equations $I_1=I_0+I_{T1}$ and $I_2=I_0+I_{T2}$. Substituting into the $R_X$ equation provides $R_X=(E_1-E_2)/((I_0+I_{T1})-(I_0+I_{T2}))$. Removing parentheses in the denominator removes the $I_0$ non-test current term, leaving $R_X$ in terms only of $E_1$, $E_2$, $I_{T1}$ and $I_{T2}$, all of which are known. The value of $R_X$ can then be calculated by control system 22. Again, this system allows the measurement of $R_X$ in the presence of a significant and unknown non-test current.

Yet another method of measuring resistance of the RUT is to run two different pulses in the same direction through the RUT and measure the difference in the voltage. The equation $R_X=(E_1-E_2)/((I_0+I_{T1})-(I_0+I_{T2}))$ still holds, and allows the calculation of $R_X$ in the presence of non-test current. For convenience, currents of 1 ampere and 2 amperes are preferred to simplify the calculation.

Yet another method of measuring resistance of the RUT uses a current ramp or current stair step source (the two being taken as practically equivalent in this discussion) and a comparator internal to control system 22. Resistance $R_X$ may be derived by using a "ramp" (linearly increasing current).

The time required for the voltage across the RUT to reach the comparator reference voltage with no test ramp applied ($T_1$), is compared with the time required for the voltage across the RUT to reach the comparator reference with the test ramp applied ($T_2$). The resistance of the RUT is then linearly proportional to $T_2-T_1$. Similarly, $T_1$ and $T_2$ can be found by a dual slope technique (time to integrate up, divided by time to integrate down to some known $V_{REF}$). Again, $R_X$ is proportional to $T_2-T_1$. The ramp may be allowed to increase until a known voltage drop is reached. By measuring the voltage before the current ramp is started, and then increasing the current until a known difference (like 1 or 10 mV) is reached, then noting the current that causes that difference, a simple calculation of resistance is possible. The increase in speed may be achieved by using a simple voltage comparator set to the proper offset value to "flag" when the proper current was reached. This is much faster than waiting for the analog-to-digital converter in voltmeter 26 to measure the voltage after each current increase step.

Yet another approach to measuring resistance of the RUT uses the RC time constant of the RUT and a known capacitor placed in series connection with the RUT to find the resistance of the RUT. Initially, the capacitor is held at full discharge by a parallel switch. When the parallel switch is opened and device $D_{ctrl}$ is closed a voltage $V_+$ will appear across the RUT and begin to exponentially decay as the capacitor charges.

The time until the 63 percent point on the RC curve will equal $R_X \times C$, so $R_X$ can easily be calculated by the data processor. This circuit can be made immune to DC components (created by other current through RUT) by AC coupling the input to voltmeter 26, so the RC decay created by the capacitor and RUT is all that is measured. In a slightly different arrangement, the capacitor is initially held discharged by the connections through a shunt resistor to ground. When the switch $D_{ctrl}$ is turned on, the capacitor begins to charge, and a voltage $V^+$ appears across the RUT. When the capacitor is fully charged, there is no current through RUT. By knowing the time that elapses between the time the switch $D_{ctrl}$ is closed and the 63 percent point on the RC curve, the RC time constant is found, and, from that, the resistance of the RUT is easily calculated.

In one embodiment the RUT is connected in a leg of a classical bridge circuit. The voltage applied to the bridge may be DC or AC. When the bridge is balanced, no output will be seen, regardless of whether the applied voltage is AC or DC. In the DC case, a calculation made by the data processor eliminates the effects of non-test current flowing through RUT. In the AC case, synchronous detection may be used so that non-test DC currents, and AC currents not at the frequency of the impressed AC, are ignored. Alternatively, any of the fixed resistors of the bridge may be replaced with an active device, such as a FET, and using the data processor in an iterative manner to achieve bridge balance and measure $R_X$. Output of voltmeter 26 is monitored so that the data processor senses whether the bridge is balanced. If it is not balanced, the input voltage applied to amplifier 25 is changed, and the bridge, again, is tested for balance. This continues until an acceptable balance is found. The resistance of the active device as a function of applied voltage is known. Knowing the applied voltage that achieves balance, therefore, will allow $R_X$ to be calculated.

The resistance of the RUT may also be measured using only an applied AC test signal. This has several advantages, including allowing the test to be made in the presence of very large DC currents and giving the system immunity to non-test AC signals. In one embodiment, control system 22 causes amplifiers 25, 27 to generate a sine wave at one or more frequencies in the 10–2,000 Hz range. A synchronous detector is used to monitor the voltage across $R_X$. All frequencies other than the test frequency are rejected, as is DC. The data processor can conveniently cause the generation of several test frequencies, and, from this, the value of any reactance in the circuit may be inferred. Vector subtraction of the reactance leaves only the resistance portion, which gives the resistance of $R_X$. Further, the magnitude and sign of the reactance portion may be used to infer the inductance or capacitance of the circuit.

TOTAL ELECTRICAL SYSTEM QUALITY

A basic system for delivering electrical energy to a load is the very familiar electrical circuit, consisting of an energy source (generator, battery, etc.) and a load (light bulb, heater coil, or television receiver). For a simple circuit, the current drawn from the source is determined by the terminal voltage of the battery and the sum of all of the resistances in the circuit including the internal resistance of the battery. An electrical energy delivery system has in the past been characterized solely in terms of the terminal voltage of the supply. While terminal voltage does supply useful information, it is not sufficient information for full characterization of the system. To characterize the system's ability to deliver energy, it is important to also specify the resistance of the delivery system including the internal resistance of the source. In the case of a vehicle electrical system, the pertinent resistances are the internal resistance of the battery and the resistances of the connecting wires, plus the resistance of any electrical junctions in the circuit.

Using the techniques previously described for finding the internal resistance or impedance of a battery, the total resistance of the delivery system, including the internal resistance/impedance of the source may be determined. Alternatively, the circuit may be broken, and the load left undisturbed, and the total resistance of the circuit measured, including the resistance of the load, in order to determine useful information regarding the circuit. A common example is that of the engine-cranking system of a vehicle. Measurement apparatus 20 can be attached to the battery terminal of the starter solenoid and case ground terminal of the electric starter. Resistance of the cables and connectors, plus the internal resistance of the battery, can then be read, and the ability of the electrical system to deliver current to the starter can be accurately predicted. Measurement apparatus 20 can also be attached to the battery and starter terminals of the solenoid, and the total DC resistance of the circuit can be measured. If this is much greater than the resistance of the delivery system alone, electrical energy will be efficiently transferred to the starter. With minor adaptations, these same techniques can be used for any load, using AC excitation as well as the DC excitation.

The ability of an electrical system to deliver power to a load is determined by the terminal voltage of the source of electrical energy, the internal resistance of the source of electrical energy, and the sum of all of the resistances in the cables and connectors. For purposes of discussion, an electrical motor with constant efficiency, F, is connected to a source of electrical energy with voltage V, which has an internal resistance $R_{INT}$. The cables and connectors in the electrical system have a total resistance $R_{EXT}$. The maximum amount of power, $P_{MAX}$, that can be delivered to the shaft of the electric motor is found to be:

$$P_{MAX} = F\frac{V^2}{4(R_{INT} + R_{EXT})}$$

$P_{MAX}$ is a very useful figure of merit, or FOM.

In some cases, it may be more desirable to express the FOM of a system in terms of the maximum current it can deliver to the terminals of a load, without the voltage at the load falling below some selected level. For example, the current that can be delivered to a vehicle starter motor, without the voltage at the terminals of the starter falling below 10 volts, may be determined. The calculation is a direct application of Ohm's Law. The same technique can be used in reverse to assess the ability of a secondary battery to accept charge through its cables and connections. In this case, measurement apparatus 20 would be attached to the alternator and the test applied. In either case, the assessment can be performed with two connections and a single test: This procedure is simple to use, and it saves a considerable amount of time.

Figure 5:
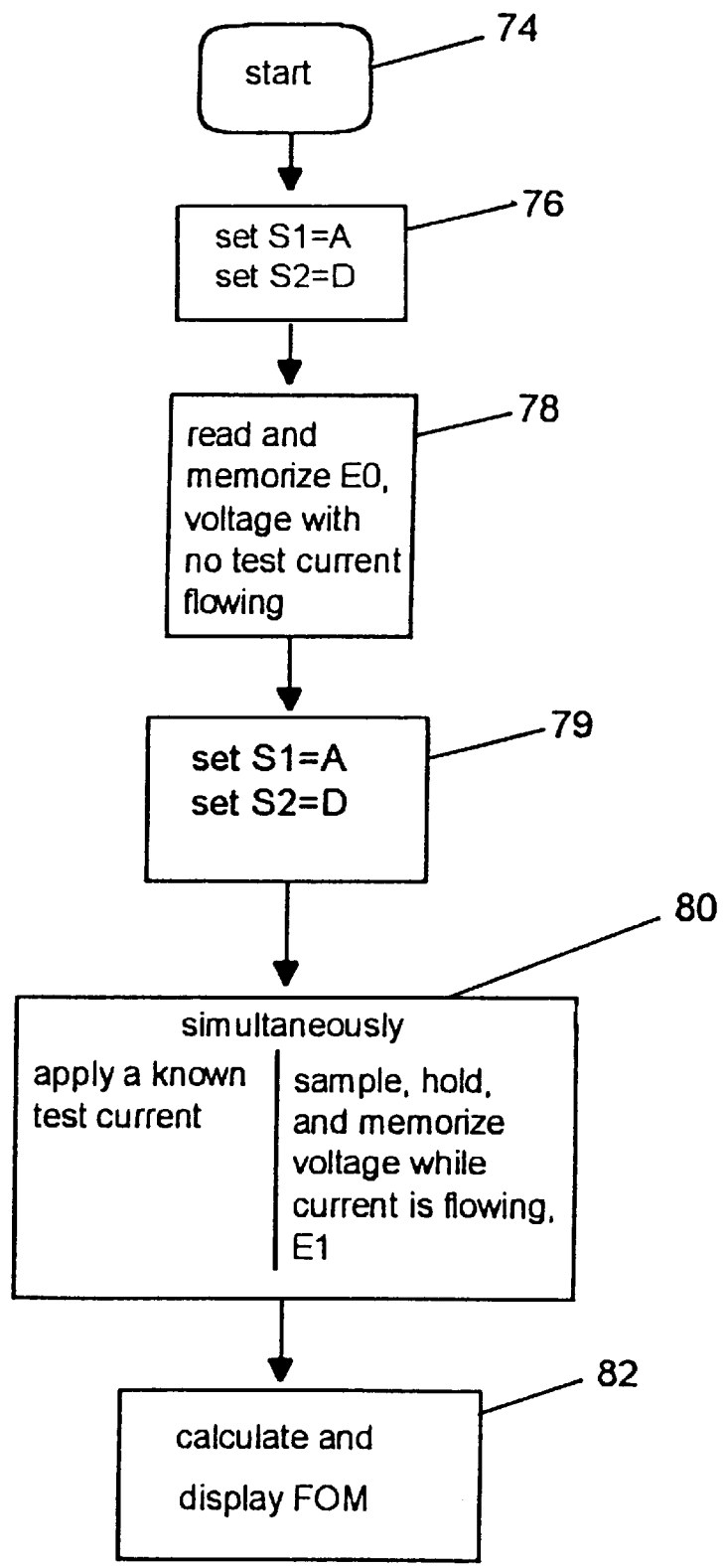
FIG. 5 is a flow chart of a method of measuring a figure of merit of a circuit according to the invention.

The flowchart of how this is done is presented in FIG. 5. In this case, BAT is the source of electrical energy, and $R_X$ is $R_{EXT}$. For example, in a vehicle, BAT would be the vehicle battery, and the test device might be applied to the starter motor input terminals to determine whether the quality of the battery and cables combined are of sufficient quality to operate the starter motor. When the figure of merit measurement method is started at 74, switch S1 is set to position A and switch S2 is set to position B at 76. The voltage across the battery is measured with voltmeter 26 with no test current flowing through the circuit at 78. Switch S2 is then set to position $D_X$. A known current is then applied through the battery and $R_{EXT}$ using amplifiers 25, 27 and the voltage across resistance $R_{INT}$ and $R_{EXT}$ is measured with voltmeter 26 at 80. The figure of merit of the circuit is calculated by control circuit 22 at 82, using the principles previously described and is displayed on display device 30.

MEASURING CURRENT

Figure 6:
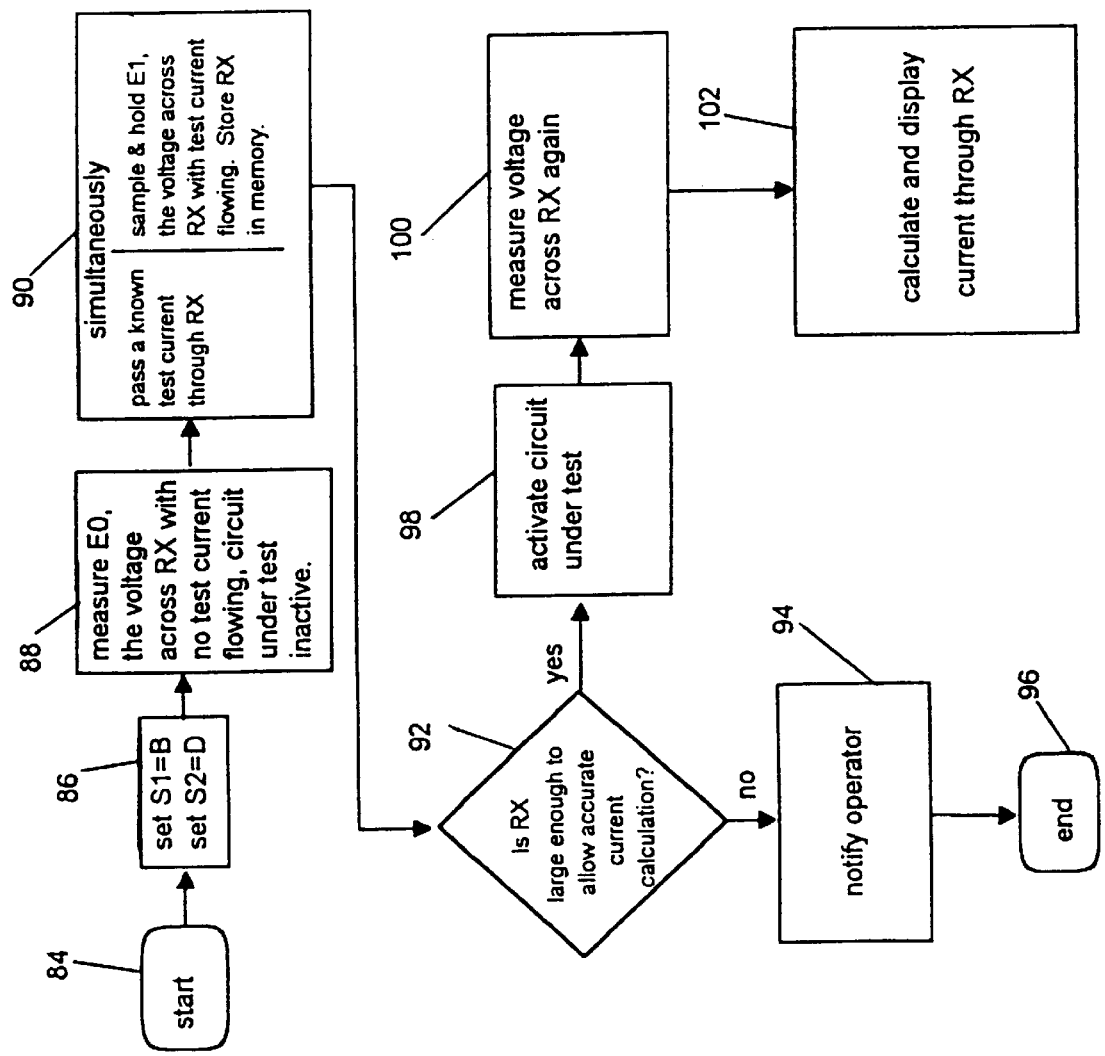
FIG. 6 is a flow chart of a method of measuring a current flowing in a circuit according to the invention.

The previously described techniques may be used for finding the resistance of any piece of conducing wire and storing the value in memory. The circuit may then be energized; for example, engaging a starter motor on a vehicle. While current is flowing, the voltage across $R_X$ is measured. From the resistance and the voltage, the current that is flowing in the circuit can be calculated. The logic for this is shown in FIG. 6. When the process for measuring current through a conductor $R_X$ is started at 84, the switch S1 is set to position B and switch S2 is set to position D at 86. The voltage across conductor $R_X$ is measured with the $R_X$ open-circuited at 88. A known current is then applied to $R_X$ by amplifiers 25, 27, and the voltage across $R_X$ is measured with voltmeter 26 at 90. The value o the resistance $R_X$ is calculated using previously described techniques, and it is then determined at 92 whether the resistance of $R_X$ is sufficiently low to allow a meaningful measurement of current to be made. If the resistance of $R_X$ is too high, or infinite, application of test current might pose a hazard to the circuit under test. If it is determined at 92 that the resistance of $R_X$ is too high, the operator is notified at 94 and the process is exited at 96 in order to protect the circuit under test. If it is determined at 92 that the resistance of $R_X$ is within an acceptable range, the circuit under test is activated at 98 and the voltage across $R_X$ is measured with voltmeter 26 at 100. Control system 22 then calculates the current flowing through $R_X$ at 103 and displays the results on display device 30. one of the AC-excitation schemes is used, it is possible to make the resistance measurement while large DC circuit currents are flowing, simplifying the procedure.

Changes and modifications in the specifically described embodiments can be carried out without departing from the principles of the invention which is intended to be limited only by the scope of the appended claims, as interpreted according to the principles of patent law including the doctrine of equivalents.

What is claimed is:

1. A method of measuring cold-cranking amps of a vehicle starting battery having a rated cold-cranking amps, including:

sourcing a current of known magnitude to or sinking a current of known magnitude from a vehicle starting battery at less than rated cold-cranking amps of the vehicle storage battery during at least one brief interval of time;

measuring terminal voltage of the vehicle starting battery during said sourcing or sinking and determining internal impedance of the vehicle starting battery from at least the measured terminal voltage;

measuring temperature of the vehicle starting battery; and calculating cold-cranking amps from the determined internal impedance and measured temperature.

2. The method in claim 1 wherein said sourcing or sinking comprises a direct current.

3. A vehicle starting battery cold-cranking amps meter comprising:
- a current source which produces a current pulse during a brief time interval at a known magnitude that is less than rated maximum cold-cranking amps of the vehicle starting battery being tested;
- a voltage meter which measures battery terminal voltage of the vehicle storage battery being tested while said current source is sourcing current to or sinking current from the vehicle starting battery being tested;
- a temperature meter measuring temperature of the vehicle storage battery being tested; and
- a control which determines internal impedance of the vehicle starting battery being tested from an output of said voltage meter while said current source is sourcing current to or sinking current from the vehicle starting battery being tested and determines cold-cranking amps from the internal impedance and an output of said temperature meter.

4. The meter in claim 3 wherein said current source produces a direct current pulse.

5. The method in claim 1 wherein said current is of a magnitude and time interval that said sourcing or sinking will not substantially alter battery condition.

6. The method in claim 1 wherein said current magnitude is between 0.01 amperes and 100 amperes.

7. The method in claim 6 wherein said current magnitude is on an order of 10 amperes.

8. The method in claim 1 wherein said interval of time is on an order of 10 milliseconds or less.

9. The method in claim 8 wherein said current magnitude is between 0.01 amperes and 100 amperes.

10. The method in claim 1 wherein said current has a substantially constant magnitude.

11. The method in claim 1 wherein said current magnitude is approximately one-half of the rated cold-cranking amps of the vehicle starting battery.

12. The method in claim 11 wherein said interval of time is on an order of 10 milliseconds or less.

13. The method in claim 1 including verifying that the charge of the vehicle starting battery is at a magnitude sufficient to conduct a valid test prior to said sourcing or sinking.

14. The method in claim 13 wherein said verifying includes measuring terminal voltage of the vehicle starting battery prior to said sourcing or sinking.

15. The method in claim 1 wherein said determining battery internal impedance includes monitoring changes in terminal voltage during said sourcing or sinking.

16. The meter in claim 3 wherein said current source produces a current of a magnitude and for a time interval that will not substantially alter battery condition.

17. The meter in claim 3 wherein said current source produces a current of a magnitude that is between 0.01 amperes and 100 amperes.

18. The meter in claim 17 wherein said current source produces a current of a magnitude that is on an order of 10 amperes.

19. The meter in claim 3 wherein said time interval is on an order of 10 milliseconds or less.

20. The meter in claim 19 wherein said current has a magnitude of between 0.01 amperes and 100 amperes.

21. The meter in claim 3 wherein said current has a substantially constant magnitude.

22. The meter in claim 3 wherein said current has a magnitude that is approximately one-half of the rated cold-cranking amps of the vehicle starting battery.

23. The meter in claim 22 wherein said time interval is on an order of 10 milliseconds or less.

24. The meter in claim 3 wherein said control verifies that the charge of the vehicle starting battery is at a magnitude sufficient to conduct a valid test prior to conducting a test.

25. The meter in claim 24 wherein said control verifies the charge in response to said voltage meter measuring terminal voltage of the vehicle starting battery prior to conducting the test.

26. The meter in claim 3 wherein said control determines battery internal impedance by monitoring changes in terminal voltage while said current source is sourcing current to or sinking current from the vehicle starting battery being tested.

* * * * *